United States Patent [19]
Foo et al.

[11] Patent Number: 5,256,967
[45] Date of Patent: Oct. 26, 1993

[54] FAST NMR IMAGE ACQUISITION WITH SPECTRALLY SELECTIVE INVERSION PULSES

[75] Inventors: Thomas K. Foo, Waukesha, Wis.; Patrick L. Le Roux, Gif/Yvette, France

[73] Assignee: General Electric Company, Milwaukee, Wis.

[21] Appl. No.: 955,097

[22] Filed: Oct. 1, 1992

[51] Int. Cl.[5] .................................. G01K 3/00
[52] U.S. Cl. .................................... 324/311; 324/309
[58] Field of Search ............... 324/300, 307, 309, 310, 324/311, 312

[56] References Cited

U.S. PATENT DOCUMENTS

| 4,973,906 | 11/1990 | Bernstein | 324/309 |
| 5,034,692 | 7/1991 | Laub et al. | 324/309 |
| 5,079,505 | 1/1992 | Deimling et al. | 324/309 |
| 5,142,231 | 8/1992 | Jensen et al. | 324/307 |

OTHER PUBLICATIONS

Simultaneous Preparation of Inversion Recovery-$T_1$ and Chemical Shift Selective Contrast Using SNAP-SHOT-FLASH-MRI, *SMRM 1992 Berlin*, Jakob, et al.
Simultaneous Spatial and Spectral Excitation, *Magnetic Resonance in Medicine* 15, 287-304 (1990), Meyer et al.
MR Imaging: Clinical Use of the Inversion Recovery Sequence, *Jour. of Computer Assisted Tomography*, 9(4):659-675, Jul./Aug., Bydder, et al.
Short-TI Inversion-Recovery Pulse Sequence: Analysis and Initial Experience in Cancer Imaging[1], *Radiology 1988*, vol. 168, No. 3, 168:827-836, Dwyer et al.
Multiple Inversion Recovery Reduces Static Tissue Signal in Angiograms, *Magnetic Resonance in Medicine* 18, 257-268 (1991), Dixon, et al.
The Importance of Phase-Encoding Order In Ultra--Short TR Snapshot MR Imaging, *Magnetic Resonance in Medicine*, 16, 481-488 (1990), Holsinger, et al.

*Primary Examiner*—Louis Arana
*Attorney, Agent, or Firm*—Quarles & Brady

[57] ABSTRACT

An NMR system performs a 2DFT or 3DFT scan using a set of steady-state free precession (SSFP) pulse sequences. A contrast preparation pulse sequence precedes each series of SSFP pulse sequences and it includes a spectrally selective RF inversion pulse timed to water to provide $T_1$ contrast between tissues having relatively long $T_1$ times, followed by a spectrally selective RF inversion pulse tuned to suppress the signals from fat.

5 Claims, 4 Drawing Sheets

FAST NMR IMAGE ACQUISITION WITH SPECTRALLY SELECTIVE INVERSION PULSES

BACKGROUND OF THE INVENTION

The field of the invention is nuclear magnetic resonance imaging methods and systems. More particularly, the invention relates to the acquisition of an NMR image data set using fast pulse sequences.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant g of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency.

The practical value of this phenomenon resides in the signal which is emitted by the excited spins after the excitation signal $B_1$ is terminated. In simple systems the excited spins induce an oscillating sine wave signal in a receiving coil. The frequency of this signal is the Larmor frequency, and its initial amplitude, $A_0$, is determined by the magnitude of the transverse magnetic moment $M_t$. The amplitude, A, of the emission signal decays in an exponential fashion with time, t:

$$A = A_0 3^{-t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field. The practical value of the $T_2$ constant is that tissues have different $T_2$ values and this can be exploited as a means of enhancing the contrast between such tissues.

Another important factor which contributes to the amplitude A of the NMR signal is referred to as the spin-lattice relaxation process which is characterized by the time constant $T_1$. It describes the recovery of the net magnetic moment M to its equilibrium value along the axis of magnetic polarization (z). The $T_1$ time constant is longer than $T_2$, much longer in most substances of medical interest. As with the $T_2$ constant, the difference in $T_1$ between tissues can be exploited to provide image contrast.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR measurement cycle, the spatial distribution of spin excitation can be controlled and the location of the resulting NMR signals can be identified.

Most NMR scans currently used to produce medical images require many minutes to acquire the necessary data. The reduction of this scan time is an important consideration, since reduced scan time increases patient throughput, improves patient comfort, and improves image quality by reducing motion artifacts. There is a class of pulse sequences which have a very short repetition time (TR) and result in complete scans which can be conducted in seconds rather than minutes. Whereas the more conventional pulse sequences have repetition times TR which are much greater than the spin-spin relaxation constant $T_2$ so that the transverse magnetization has time to relax between the phase coherent excitation pulses in successive sequences, the fast pulse sequences have a repetition time TR which is less than $T_2$ and which drives the transverse magnetization into a steady-state of equilibrium. Such techniques are referred to as steady-state free precession (SSFP) techniques and they are characterized by a cyclic pattern of transverse magnetization in which the resulting NMR signal refocuses at each RF excitation pulse to produce an echo signal. This echo signal includes a first part S+ that is produced after each RF excitation pulse and a second part S— which forms just prior to the RF excitation pulse.

There are two well known SSFP pulse sequences used to produce images. The first is called gradient refocused acquired steady-state (GRASS) and it utilizes a readout gradient $G_x$ to shift the peak in the S+ signal that is produced after each RF excitation pulse toward the center of the pulse sequence. This pulse sequence is shown in FIG. 3, where the NMR signal is an S+ gradient echo that is induced by the readout gradient $G_x$. In two-dimensional imaging, a slice selection gradient pulse is produced by the gradient $G_z$ and is immediately refocused in the well-known manner. A phase encoding gradient pulse $G_y$ is produced shortly thereafter to position encode the acquired NMR data, and to preserve the steady-state equilibrium, the effects of the phase encoding gradient pulse are nullified by a corresponding $G_y$ rewinder gradient pulse after the NMR signal has been acquired and before the next pulse sequence begins as described in U.S. Pat. No. 4,665,365.

The second well known SSFP pulse sequence is called contrast enhanced fast imaging (SSFP-ECHO) and it utilizes the S— signal that is produced just prior to each RF excitation pulse. This pulse sequence is shown in FIG. 4, where the acquired NMR signal is an S— echo signal caused by the gradient refocusing of the transverse magnetization which would otherwise refocus at the next RF excitation pulse. The readout gradient $G_x$ is substantially different in this pulse sequence and includes a positive pulse prior to the actual readout pulse and a negative pulse after the readout pulse. The former pulse dephases the FID signal (S+) which might otherwise be produced during the data acquisition window, and the latter pulse causes the transverse magnetization to rephase during the next pulse sequence to produce the echo signal S−. For a more detailed discussion of the SSFP-ECHO pulse sequence, reference is made to an article by R. C. Hawkes and S. Patz entitled "Rapid Fourier Imaging Using Steady-State Free Precision", published in Magnetic Resonance in Medicine 4, pp. 9-23 (1987).

Because SSFP sequences employ RF excitation pulses with small tip angles and the magnetization is not allowed to recover after each pulse sequence, the image contrast due to spin density is not nearly as good as with conventional pulse sequences. Consequently, other image contrast enhancement methods have been proposed which rely on the different $T_1$ and $T_2$ constants of tissues. As described by A. Haase in "Snapshot Flash MRI Applications to T1, T2, and Chemical-Shift Imaging," *Magnetic Resonance In Medicine*, 13, 77/14 89 (1990), and D Matthaei et al in "Fast Inversion Recovery $T_1$ Contrast and Chemical Shift Contrast In High-Resolution Snapshot Flash MR Images," *Magnetic Resonance Imaging*, Vol 10, pp. 1-6, 1992, a series of SSFP pulse sequences may be preceded by one or more preparatory RF pulses which condition the spin magnetization to provide $T_1$ or $T_2$ enhanced contrast images. In some 2D acquisitions a single preparatory period followed by the acquisition of all the image views will suffice. However, in 3D acquisitions and in multi-slice 2D acquisitions the scan is divided into a series of data acquisition periods which are each preceded by a contrast enhancement preparatory period.

Rapid acquisition of fat suppressed images is essential in the diagnosis of breast lesions. SSFP pulse sequences inherently provide images with good $T_1$ contrast. By injecting the patient with a contrast agent such as Gadolinium, the $T_1$ constant of tumor cells is shortened relative to the surrounding muscle and fiber tissues and produces a characteristic pattern in an SSFP image. However, fat tissues also have a short $T_1$ time, and they will also appear brightly in the image. These images must be acquired within two to three minutes in order to maximize the effect of the Gadolinium tumor contrast agent, and the signals from fat tissues must be suppressed so that the tumor can be seen against the background of other tissues which have a longer $T_1$ time. In addition, these images must be rapidly acquired before the Gadolinium has perfused through normal tissues which tend to mask the signal from tumors.

Spatially selective inversion recovery prepared NMR imaging is a method by which a series of fast NMR pulse sequences are preceded by a contrast preparation sequence. While such methods provide $T_1$ contrast of tissues, they provide contrast for only one group of $T_1$ species at a time. For example, several investigators have attempted to use short inversion time (STIR) methods as a way of suppressing fat. Unfortunately, STIR techniques not only suppress fat but also all short $T_1$ species. Thus, if Gadolinium (Gd) contrast agents are used, the signal enhancement of tumors due to the shortening of $T_1$ is cancelled out by the STIR experiment.

Oh et al proposed using a spectrally selective inversion pulse as a method of suppressing fat signal without suppressing other $T_1$ species, "Selective Partial Inversion Recovery (SPIR) In The Steady State For Selective Magnetic Resonance Imaging," *Book of Abstracts: Society of Magnetic Resonance in Medicine* 1988: 1042. While this does suppress fat signal relative to other short $T_1$ species, there is still appreciable signal from the water-based tissues, such as muscle, liver, etc. and the CNR of Gd-enhanced tumors is not significantly increased relative to these surrounding tissues. Malgouyres et al has proposed a multiple inversion recovery contrast preparation sequence to improve the contrast in CSF of brain images, "Multi-inversion Sequence For CSF Imaging," *In: Resume Des Communications Orales Et Afficees*-2eme Congres Sur La Recherche En Imagerie Medicale, 10-12 October, 1990:87. The inversion recovery pulses proposed, however, are only spatially selective and the signal from Gd-enhanced tissue is suppressed along with fat signal.

SUMMARY OF THE INVENTION

The present invention relates to a fast NMR scan which employs a series of steady-state free precession pulse sequences to acquire either a 2DFT or 3DFT NMR data set. More specifically, the present invention is an NMR system which performs a scan as a set of SSFP pulse sequences preceded by a contrast preparation pulse sequence comprised of two inversion recovery RF pulses, the first inversion recovery RF pulse being spectrally selective on water protons and timed such that the longitudinal magnetization of spins having a relatively long $T_1$ relaxation time is minimal at the start of the set of SSFP pulse sequences, and the second inversion recovery RF pulse being spectrally selective on fat protons and timed such that the longitudinal magnetization of spins associated with fat is minimal at the start of the set of SSFP pulse sequences. The first inversion recovery RF pulse is spectrally selective to provide the necessary $T_1$ contrast for water based tissues with moderately long $T_1$, such as normal muscle or fibrous tissue. The second inversion recovery pulse is spectrally selective to provide the necessary fat suppression using a short inversion time (TI) while leaving the water-based short $T_1$ species, such as tissues with concentrations of Gd, unaffected. As a result, tumors which absorb Gd appear brighter than other tissues because the longitudinal magnetization of spins in such other tissues are selectively suppressed by the contrast preparation pulse sequence.

An object of the invention is to improve the contrast of Gd enhanced tissues in images produced from fast NMR pulse sequences. The two spectrally selective inversion recovery RF pulses selectively suppress the signals from all tissues relative to Gd enhanced tissues provided the appropriate inversion times (TI) are used. This provides a unique contrast mechanism which enables Gd enhanced tissues such as tumors to be more clearly distinguished from normal tissues.

Another object of the invention is to provide $T_1$ contrast and fat suppression in images produced from fast NMR pulse sequences. By choosing the appropriate inversion times (TI), for example, protons associated with CSF can be spectrally selected and suppressed with the first inversion recovery RF pulse and the protons associated with fat can be suppressed by the second inversion recovery RF pulse when imaging the lumbar spine. As a result, nerve roots can be more clearly seen in the reconstructed image and disease can be more easily visualized.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
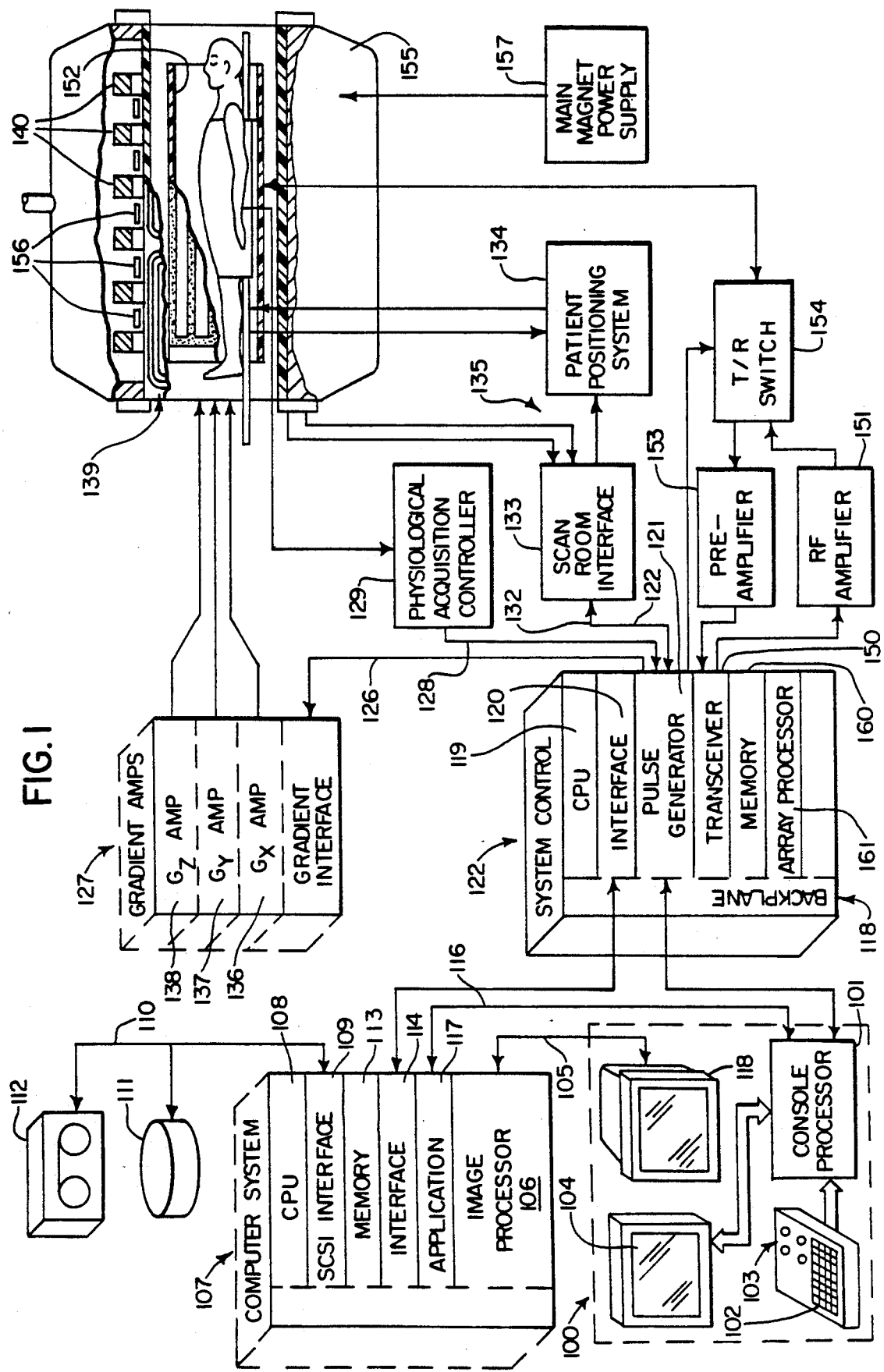
FIG. 1 is a block diagram of an NMR system which employs the present invention.

Referring first to FIG. 1, there is shown the major components of a preferred NMR system which incorporates the present invention and which is sold by the General Electric Company under the trademark "SIGNA". The operation of the system is controlled from an operator console 100 which includes a console processor 101 that scans a keyboard 102 and receives inputs from a human operator through a control panel 103 and a plasma display/touch screen 104. The console processor 101 communicates through a communications link 116 with an applications interface module 117 in a separate computer system 107. Through the keyboard 102 and controls 103, an operator controls the production and display of images by an image processor 106 in the computer system 107, which connects directly to a video display 118 on the console 100 through a video cable 105.

The computer system 107 is formed about a backplane bus which conforms with the VME standards, and it includes a number of modules which communicate with each other through this backplane. In addition to the application interface 117 and the image processor 106, these include a CPU module 108 that controls the VME backplane, and an SCSI interface module 109 that connects the computer system 107 through a bus 110 to a set of peripheral devices, including disk storage 111 and tape drive 112. The computer system 107 also includes a memory module 113, known in the art as a frame buffer for storing image data arrays, and a serial interface module 114 that links the computer system 107 through a high speed serial link 115 to a system interface module 120 located in a separate system control cabinet 122.

The system control 122 includes a series of modules which are connected together by a common backplane 118. The backplane 118 is comprised of a number of bus structures, including a bus structure which is controlled by a CPU module 119. The serial interface module 120 connects this backplane 118 to the high speed serial link 115, and pulse generator module 121 connects the backplane 118 to the operator console 100 through a serial link 125. It is through this link 125 that the system control 122 receives commands from the operator which indicate the scan sequence that is to be performed.

The pulse generator module 121 operates the system components to carry out the desired scan sequence. It produces data which indicates the timing, strength and shape of the RF pulses which are to be produced, and the timing of and length of the data acquisition window. The pulse generator module 121 also connects through serial link 126 to a set of gradient amplifiers 127, and it conveys data thereto which indicates the timing and shape of the gradient pulses that are to be produced during the scan. The pulse generator module 121 also receives patient data through a serial link 128 from a physiological acquisition controller 129. The physiological acquisition control 129 can receive a signal from a number of different sensors connected to the patient. For example, it may receive ECG signals from electrodes or respiratory signals from a bellows and produce pulses for the pulse generator module 121 that synchronizes the scan with the patient's cardiac cycle or respiratory cycle. And finally, the pulse generator module 121 connects through a serial link 132 to scan room interface circuit 133 which receives signals at inputs 135 from various sensors associated with the position and condition of the patient and the magnet system. It is also through the scan room interface circuit 133 that a patient positioning system 134 receives commands which move the patient cradle and transport the patient to the desired position for the scan.

The gradient waveforms produced by the pulse generator module 121 are applied to a gradient amplifier system 127 comprised of $G_x$, $G_y$ and $G_z$ amplifiers 136, 137 and 138, respectively. Each amplifier 136, 137 and 138 is utilized to excite a corresponding gradient coil in an assembly generally designated 139. The gradient coil assembly 139 forms part of a magnet assembly 141 which includes a polarizing magnet 140 that produces either a 0.5 or a 1.5 Tesla polarizing field that extends horizontally through a bore 142. The gradient coils 139 encircle the bore 142, and when energized, they generate magnetic fields in the same direction as the main polarizing magnetic field, but with gradients $G_x$, $G_y$ and $G_z$ directed in the orthogonal x-, y- and z-axis directions of a Cartesian coordinate system. That is, if the magnetic field generated by the main magnet 140 is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x,y,z) in the bore of the magnet assembly 141 is given by $B(x,y,z) = B_0 + G_x x + G_y y G_z z$. The gradient magnetic fields are utilized to encode spatial information into the NMR signals emanating from the patient being scanned.

Located within the bore 142 is a circular cylindrical whole-body RF coil 152. This coil 152 produces a circularly polarized RF field in response to RF pulses provided by a transceiver module 150 in the system control cabinet 122. These pulses are amplified by an RF amplifier 151 and coupled to the RF coil 152 by a transmit/receive switch 154 which forms an integral part of the RF coil assembly. Waveforms and control signals are provided by the pulse generator module 121 and utilized by the transceiver module 150 for RF carrier modulation and mode control. The resulting NMR signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

In addition to supporting the polarizing magnet 140 and the gradient coils 139 and RF coil 152, the main magnet assembly 141 also supports a set of shim coil 156 associated with the main magnet 140 and used to correct inhomogeneities in the polarizing magnet field. The main power supply 157 is utilized to bring the polarizing field produced by the superconductive main magnet 140 to the proper operating strength and is then removed.

The NMR signals picked up by the RF coil 152 are digitized by the transceiver module 150 and transferred to a memory module 160 which is also part of the system control 122. When the scan is completed and an entire array of data has been acquired in the memory modules 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the video display 118.

Figure 2:
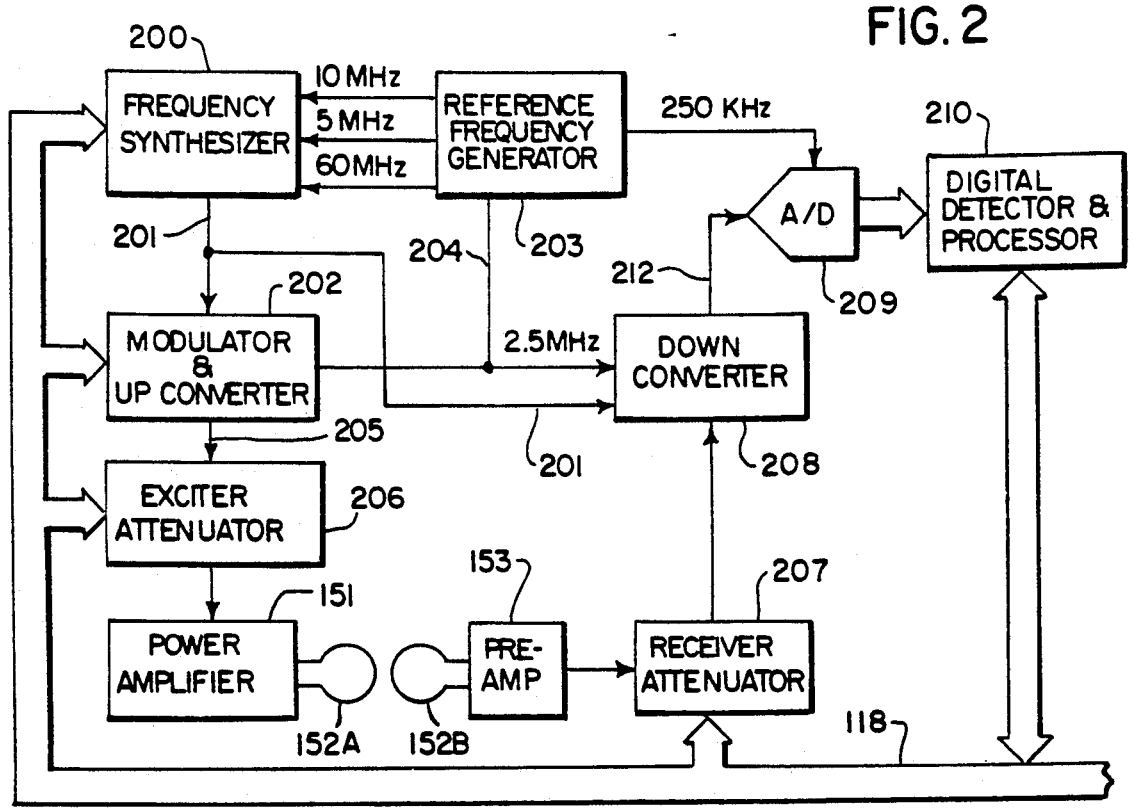
FIG. 2 is an electrical block diagram of the transceiver which forms part of the NMR system of FIG. 1.

Referring particularly to FIGS. 1 and 2, the transceiver 150 includes components which produce the RF excitation field $B_1$ through power amplifier 151 at a coil 152A and components which receive the resulting NMR signal induced in a coil 152B. As indicated above, the coils 152A and B may be separate as shown in FIG. 2, or they may be a single whole-body coil as shown in FIG. 1. The base, or carrier, frequency of the RF excitation field is produced under control of a frequency synthesizer 200 which receives a set of digital signals (CF) through the backplane 118 from the CPU module 119 and pulse generator module 121. These digital signals indicate the frequency and phase of the RF carrier signal which is produced at an output 201. The commanded RF carrier is applied to a modulator and up converter 202 where its amplitude is modulated in response to a signal R(t) also received through the backplane 118 from the pulse generator module 121. The signal R(t) defines the envelope, and therefore the bandwidth, of the RF excitation pulse to be produced. It is produced in the module 121 by sequentially reading out a series of stored digital values that represent the desired envelope. These stored digital values may, in turn, be changed from the operator console 100 to enable any desired RF pulse envelope to be produced. The modulator and up converter 202 produces an RF pulse at the desired Larmor frequency at an output 205.

The magnitude of the RF excitation pulse output through line 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIG. 1 and 2 the NMR signal produced by the subject is picked up by the receiver coil 152B and applied through the preamplifier 153 to the input of a receiver attenuator 207. The receiver attenuator 207 further amplifies the NMR signal and this is attenuated by an amount determined by a digital attenuation signal (RA) received from the backplane 118. The receive attenuator 207 is also turned on and off by a signal from the pulse generator module 121 such that it is not overloaded during RF excitation.

The received NMR signal is at or around the Larmor frequency, which in the preferred embodiment is around 63.86 MHz for 1.5 Tesla and 21.28 MHz for 0.5 Tesla. This high frequency signal is down converted in a two step process by a down converter 208 which first mixes the NMR signal with the carrier signal on line 201 and then mixes the resulting difference signal with the 2.5 MHz reference signal on line 204. The resulting down converted NMR signal on line 212 has a maximum bandwidth of 125 kHz and it is centered at a frequency of 187.5 kHz. The down converted NMR signal is applied to the input of an analog-to-digital (A/D) converter 209 which samples and digitizes the analog signal at a rate of 250 kHz. The output of the A/D converter 209 is applied to a digital detector and signal processor 210 which produce 16-bit in-phase (I) values and 16-bit quadrature (Q) values corresponding to the received digital signal. The resulting stream of digitized I and Q values of the received NMR signal is output through backplane 118 to the memory module 160 where they are employed to reconstruct an image.

To preserve the phase information contained in the received NMR signal, both the modulator and up converter 202 in the exciter section and the down converter 208 in the receiver section are operated with common signals. More particularly, the carrier signal at the output 201 of the frequency synthesizer 200 and the 2.5 MHz reference signal at the output 204 of the reference frequency generator 203 are employed in both frequency conversion processes. Phase consistency is thus maintained and phase changes in the detected NMR signal accurately indicate phase changes produced by the excited spins. The 2.5 MHz reference signal as well as 5, 10 and 60 MHz reference signals are produced by the reference frequency generator 203 from a common 20 MHz master clock signal. The latter three reference signals are employed by the frequency synthesizer 200 to produce the carrier signal on output 201. For a more detailed description of the receiver, reference is made to U.S. Pat. No. 4,992,736 which is incorporated herein by reference.

Figure 3:
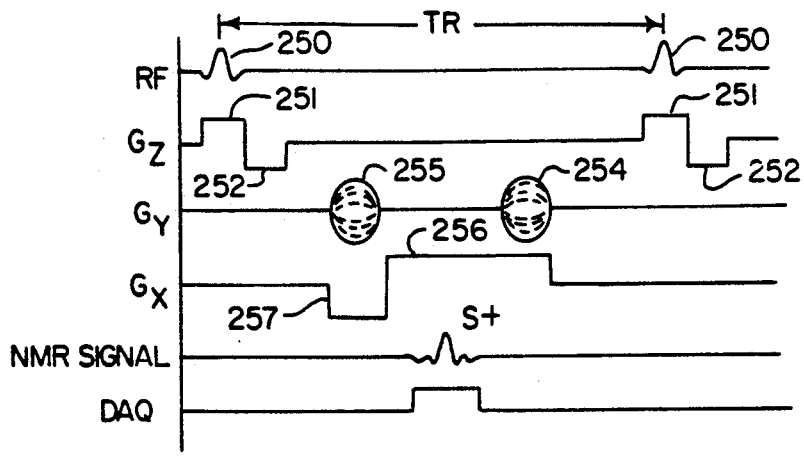
FIGS. 3 and 4 are graphic representations of two steady-state free precession (SSFP) pulse sequences which may be employed by the NMR system of FIG. 1 in a 2DFT scan according to the present invention.
Figure 4:
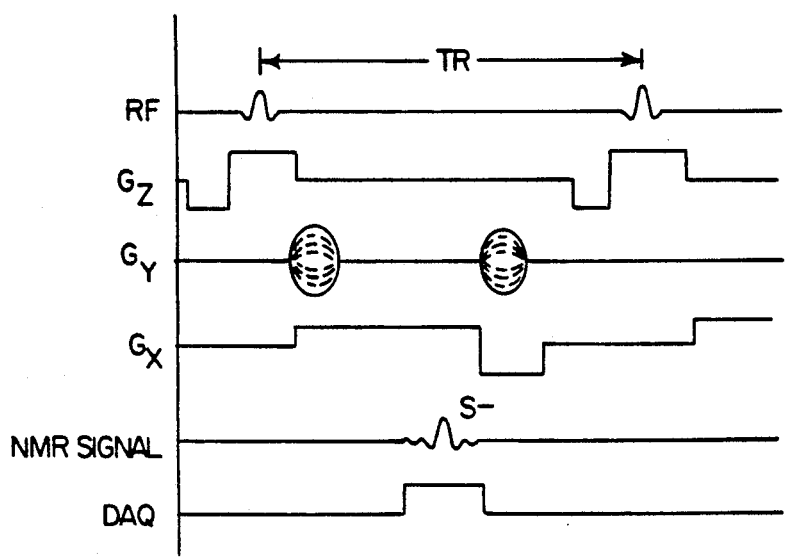
Figure 5:
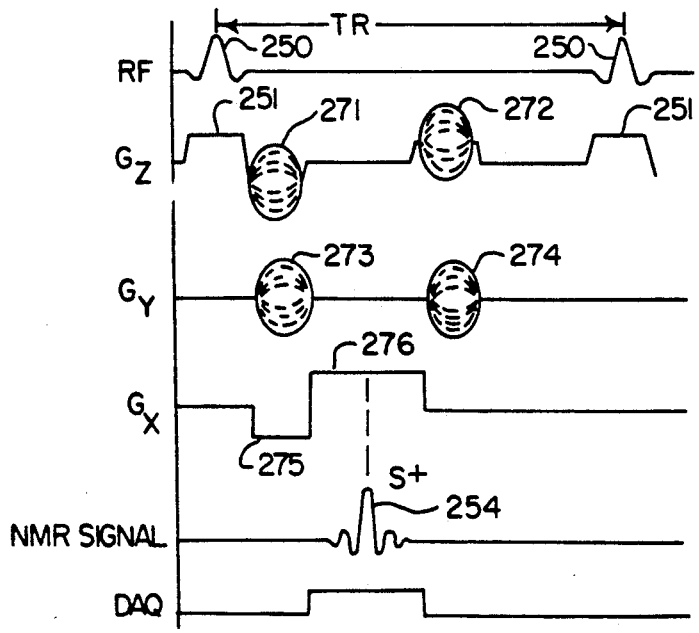
FIG. 5 is a graphic representation of a 3DFT SSFP pulse sequence, which may be employed by the NMR system of FIG. 1 to practice the present invention.

The pulse sequences used in the preferred embodiments of the invention are shown in FIGS. 3 and 5. These are 2DFT and 3DFT SSFP pulse sequences, respectively. Although S+ SSFP pulse sequences are preferred, the invention is also easily applied to 2DFT and 3DFT S− SSFP pulse sequences. The selected pulse sequence is downloaded to the pulse generator 121 (FIG. 1) and is played out during the scan to control the transceiver 150 and gradient amplifiers 127. At the completion of the scan the acquired NMR data set is processed in the well known manner to reconstruct an image. In the case of the 2DFT data, a set of contiguous slices are acquired through the patient and a two-dimensional Fourier transformation is performed on each slice to produce a corresponding set of images. The 3DFT data, on the other hand is processed with a three-dimensional Fourier transformation and an image may be reconstructed from any projection angle through the resulting three-dimensional array of image data.

Referring particularly to FIG. 3, the 2DFT fast pulse sequence is characterized by a series of RF excitation pulses 250 which have a magnitude and duration sufficient to tip the net magnetization by an angle of less than 90°. In the preferred embodiment a tip angle of 10° to 40° is employed. The RF excitation pulses 250 are spaced apart by a very short repetition time (TR) typically in the range of 6 to 12 milliseconds. This repetition time is less than the spin-spin relaxation time $T_2$ of water and tissue and a steady-state equilibrium is established after a few pulses in which the transverse magnetization cycles between a maximum, a minimum and back to a maximum during each interval TR.

The 2DFT pulse sequence of FIG. 3 uses the z axis magnetic field gradient $G_z$ to select a slice of spins for the measurement. More specifically, the RF excitation pulses 250 are spatially selective, and a $G_z$ gradient pulse 251 is produced at the same time to excite spins in the desired slice. A $G_z$ gradient rephasing pulse 252 is produced after each slice select pulse 251 to rephase the spin prior to the subsequent readout of the S+ NMR signal. Position along the Y axis is phase encoded into the S+ NMR signal by a $G_y$ phase encoding gradient pulse 255. This phase encoding occurs before the S+ NMR signal is acquired and a second GY pulse 254 rewinds, or rephases, the spins to maintain equilibrium. The amplitude of these phase encoding pulses 254 and 255 are equal to each other, but they are changed from view-to-view to acquire NMR data for a complete scan.

Positioned between these phase encoding gradient pulses 254 and 255 is a readout gradient pulse 256 which is applied as the S+ NMR signal is acquired. This readout gradient pulse 256 refocuses the S+ NMR signal and it frequency encodes the acquired data in the well known manner. In addition, a negative $G_x$ gradient pulse 257 is produced prior to the readout pulse 256 to dephase the spins and set up the production of the S+ NMR echo signal.

The pulse sequence of FIG. 5 is substantially the same as that of FIG. 3, except that is employed with a 3DFT reconstruction method. The difference between the pulse sequences used for 2DFT and 3DFT reconstruction methods lies in the $G_z$ magnetic field gradient pulses. A selective 3DFT sequence is shown in which a $G_z$ gradient pulse 251 is applied concurrently with the RF excitation pulse 250. A $G_z$ pulse 271 is applied immediately thereafter and functions as a combined rephasing lobe of the slice selection gradient and as a slice encoding gradient. After the acquisition of the NMR signal, a third $G_z$ gradient pulse 272 is applied and functions as a crusher gradient on the z-axis to spoil the S—SSFP signal, and as a slice encoding rewinder pulse. The $G_z$ gradient pulses 271 and 272 are stepped through n values, where n is the number of samples acquired along the z-axis. The $G_y$ phase encoding gradient includes a first pulse 273 which phase encodes the signal prior to acquisition, and a second, rewinder pulse 274 which is applied after signal acquisition. The pulses 273 and 274 are stepped through m values during the scan, where m is the number of samples acquired along the y-axis. And finally, the $G_x$ readout gradient includes a dephasing lobe 275 and a readout gradient lobe 276. The data acquisition window is concurrent with the $G_x$ readout pulse 276 and the NMR S+ signal 254 is sampled 256 times during each acquisition. During the scan, the $G_y$ and $G_z$ phase encoding gradient pulses are stepped through their appropriate imaging values and the NMR signals 254 are acquired, digitized and processed in the well known manner.

In either the 2DFT or 3DFT scan a series of these SSFP pulse sequences are conducted in which one of the position encoding gradients is stepped through its values. In the preferred embodiments, the phase encoding $G_y$ gradient is stepped through 128 values. At the completion of this series, another gradient is stepped, or incremented, to its next value and the series of SSFP pulse sequences is repeated. In the preferred embodiments, the $G_z$ gradient is stepped through 32 or 64 values. This sequence repeats until all values of the second gradient have been acquired.

Figure 6:
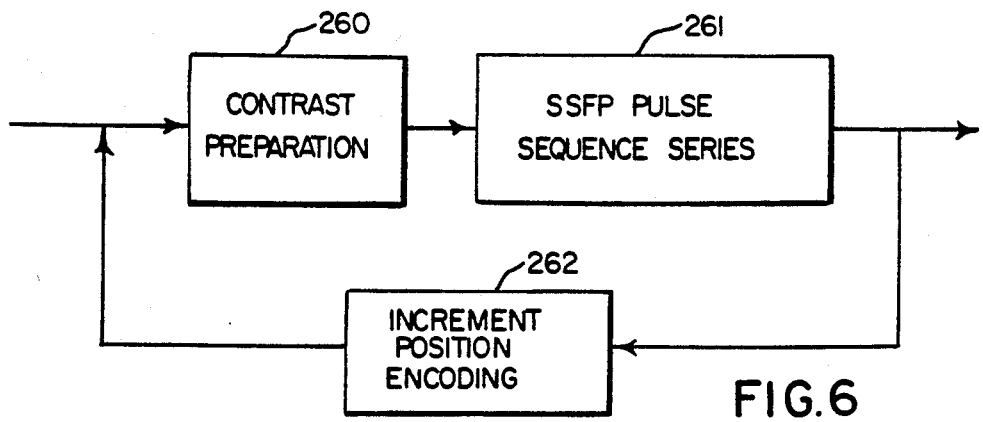
FIG. 6 is a schematic representation of the scan employed by the NMR system of FIG. 1 to practice the present invention.

The scan according to the teachings of the present invention is illustrated in FIG. 6. The NMR system enters into a loop in which it performs a contrast preparation sequence indicated by process block 260 followed by a data acquisition process comprised of a series of SSFP pulse sequences indicated by process block 261. The series of SSFP pulse sequences are either 2DFT or 3DFT sequences as described above, and at the completion of the series, the $G_z$ gradient is incremented to its next level as indicated at process block 262. The system immediately loops back to perform another contrast preparation sequence and another series of SSFP sequences with the new $G_z$ position encoding value without allowing time for magnetization recovery. As described in co-pending U.S. patent application Ser. No. 07/902,634 filed on Jun. 23, 1992 and entitled "Fast NMR Image Acquisition With Spectrally Selective Inversion Pulse," this provides an inversion recovery method in the steady state which not only reduces total scan time, but also results in a truer $T_1$ contrast image weighting than a conventional inversion recovery acquisition.

Figure 7:
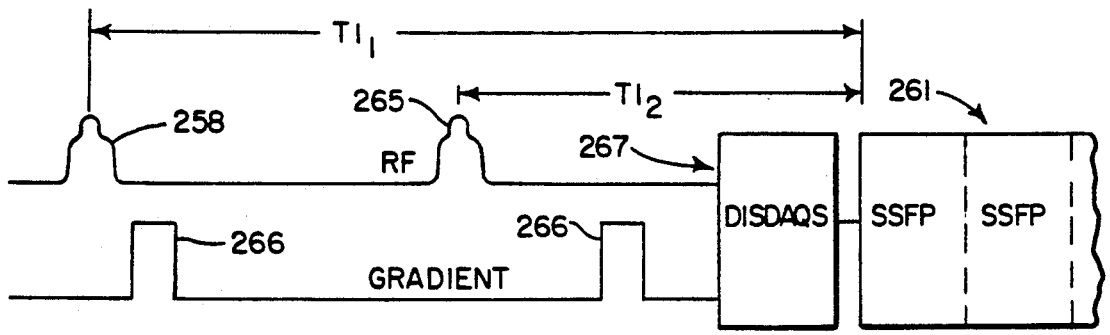
FIG. 7 is a schematic representation of a portion of the scan in FIG. 6, which illustrates in more detail the contrast preparation.

Referring particularly to FIG. 7, the present invention relates to the contrast preparation pulse sequence used in connection with the above scanning steps. More specifically, it includes a first spectrally selective RF inversion pulse 258 set at the water resonance followed by a second, spectrally selective RF inversion pulse 265 set at the fat resonance. The first RF inversion pulse 258 is produced at a time interval ($TI_1$) before the commencement of the series of SSFP pulse sequences 261, and the second RF inversion pulse 265 is produced at a time interval ($TI_2$) before the pulse sequence. The first recovery interval $TI_1$ is set to 200 to 500 milliseconds. A value of 200-300 milliseconds is employed to suppress normal breast tissues, for example, and a value of 400-500 milliseconds is employed for tissue contrast in the lumbar spine. The second RF inversion pulse 265 is spectrally shaped to invert only the fat protons, while spins associated with other tissues are substantially unaffected by the contrast preparation sequence 260. The time interval ($TI_2$) is selected such that the magnetization produced by the lipid spins recovers to approximately zero when the SSFP pulse sequence series 261 is begun. This is approximately 140 milliseconds during the initial pass when magnetization is fully recovered, but drops to approximately 60 milliseconds for subsequent passes, when lipid spins have reached their dynamic equilibrium magnetization. In contrast, the spins associated with other breast tissues are unaffected by the spectrally selective inversion pulse 265 (tuned to lipids) and they maintain the magnetization established by the first RF inversion pulse 258. As a result, the normal muscle spins and lipid spins produce little signal and the Gadolinium laden tissues appear brighter than the surrounding tissues in the reconstructed image.

The contrast preparation sequence 260 may also include gradient pulses 266 which serve to dephase any residual transverse magnetization from the inversion pulses 258 and 265. Also, prior to the collection of data using the SSFP pulse sequence series 261, a series of SSFP pulse sequences in which no data is acquired may be executed. Such pulse sequences are referred to as "disdaqs" and are indicated in FIG. 7 by process block 267. These are necessary to stabilize the magnetization as it recovers from the inversion pulses 258 and 265.

Figure 8A:
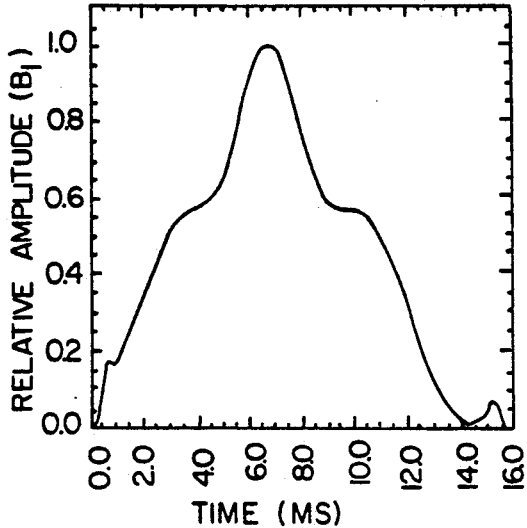
FIGS. 8A and 8B are respective graphic representations of the spectrally selective RF inversion pulse envelope employed in the contrast preparation of FIG. 7, and the resulting effect on spin magnetization of a single pulse.
Figure 8B:
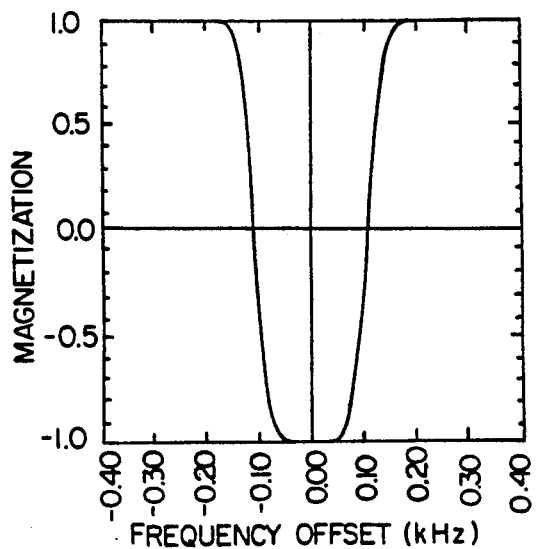

The spectrally selective RF inversion pulses 258 and 265 are 16 millisecond quadratic phase pulses whose magnitude profile is shown in FIG. 8A. The flip angle of this pulse is 180° and the range of frequencies which are inverted thereby is illustrated in FIG. 8B. The frequency of the inversion pulse 265 is set to the Larmor frequency of the spins being selected for suppression, which in the case of lipids in a 1.5 Tesla polarizing magnetic field is approximately −220 Hertz from the water resonance of 63.86 MHz. The Larmor frequency of other tissues of interest in a 1.5 Tesla field are offset by more than 0.10 kHz from this selected frequency range and are substantially unaffected by the inversion pulse 258 or 265.

In a first preferred embodiment of the invention the 3DFT SSFP pulse sequence of FIG. 5 is employed with a TR of 8 to 15 milliseconds to image breast lesions. The RF inversion pulse 265 is tuned to suppress lipids, and the time interval (TI$_2$) is set to 160 milliseconds during the first contrast preparation pulse sequence of the scan and is shortened to 80 milliseconds during subsequent contrast preparation pulse sequences. Four disdaq pulse sequences are employed just prior to each SSFP pulse sequence series. During each SSFP pulse sequence series the G$_z$ gradient is stepped through all of its values in a centric view order to acquire NMR data for one x-z plane through the three-dimensional space. The G$_y$ phase encoding gradient is then incremented to its next value and the contrast preparation/SSFP pulse sequence series is immediately repeated to acquire another x-z plane. The entire scan with 128 samples along the y gradient, 256 samples along the x gradient and 32 samples along the z axis with centric view ordering requires 57 seconds, which is within the target acquisition period required for breast examinations using Gadolinium contrast agents.

In examinations in which greater than 32 samples along the z-axis are acquired, the image acquisition may be segmented. For example, if 64 samples along the z-axis are acquired, the acquisition may be segmented such that 32 slice samples (with appropriate acquisition order) are acquired in the first segment, followed by the next 32 slice samples after preparatory pulses. The purpose of the segmentation is to reduce edge blurring artifacts in the slice encode (z-axis) direction. If still greater samples along the z-axis are acquired, the acquisition can be further segmented so as to reduce the edge blurring artifacts. The choice of acquisition order depends on the segmentation.

A second embodiment of the invention employs the 2DFT SSFP pulse sequence of FIG. 3 with a TR of 6–14 milliseconds. For fat suppression, TI$_2$ preparation times of between 100 and 120 milliseconds are typically used for the first excitation and much shorter preparation times (50 to 80 milliseconds) are used for subsequent excitation. In a typical prepared 2DFT scan, 128 samples along the y-axis are acquired with 256 samples along the x-axis. Centric view acquisition order is used to enhance contrast from the contrast preparation sequence. Total scan times for a single excitation 2DFT scan is between 1.0 to 2.0 seconds.

We claim:

1. In an NMR system, a method for conducting a scan in which a set of steady-state free precession pulse sequences are preceded by a contrast preparation pulse sequence which comprises:
   a) producing a first spectrally selective RF inversion pulse which is tuned to the Larmor frequency of a first selected spin species to be suppressed in the reconstructed image and which occurs at a first inversion recovery interval TI$_1$, prior to the execution of the set of steady-state free precession pulse sequences, and
   b) producing a second spectrally selective RF inversion pulse which is tuned to the Larmor frequency of a second selected spin species to be suppressed in the reconstructed image and which occurs at a second inversion recovery interval TI$_2$ prior to the execution of the set of steady-state free precession pulse sequences.

2. The method as recited in claim 1 in which the first RF inversion pulse is spectrally selective to water and the second RF inversion pulse is spectrally selective to lipids.

3. The method as recited in claim 1 in which a dephasing gradient pulse is produced during the second inversion recovery interval TI$_2$.

4. The method as recited in claim 3 in which a second dephasing gradient pulse is produced between the first and second RF inversion pulses.

5. The method as recited in claim 1 in which the first inversion recovery period TI, is within the range of 200 to 500 milliseconds.

* * * * *